(12) United States Patent
Cheng et al.

(10) Patent No.: US 10,615,277 B2
(45) Date of Patent: Apr. 7, 2020

(54) VFET CMOS DUAL EPITAXY INTEGRATION

(71) Applicant: International Business Machines Corporation, Armonk, NY (US)

(72) Inventors: Kangguo Cheng, Schenectady, NY (US); Ruilong Xie, Schenectady, NY (US); Tenko Yamashita, Schenectady, NY (US); Chun-Chen Yeh, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/569,770

(22) Filed: Sep. 13, 2019

(65) Prior Publication Data

US 2020/0006554 A1 Jan. 2, 2020

Related U.S. Application Data

(63) Continuation of application No. 15/986,886, filed on May 23, 2018, now Pat. No. 10,468,525.

(51) Int. Cl.
| | | |
|---|---|---|
| *H01L 29/78* | (2006.01) | |
| *H01L 29/66* | (2006.01) | |
| *H01L 21/285* | (2006.01) | |
| *H01L 27/092* | (2006.01) | |
| *H01L 21/8238* | (2006.01) | |

(52) U.S. Cl.
CPC .... *H01L 29/7827* (2013.01); *H01L 21/28518* (2013.01); *H01L 21/823885* (2013.01); *H01L 27/092* (2013.01); *H01L 29/6656* (2013.01); *H01L 29/66666* (2013.01); *H01L 29/66787* (2013.01)

(58) Field of Classification Search
CPC ............ H01L 29/7827; H01L 29/6656; H01L 21/823885; H01L 27/092; H01L 29/66787; H01L 29/66666; H01L 21/28518
See application file for complete search history.

(56) References Cited

U.S. PATENT DOCUMENTS

| 7,683,428 B2 * | 3/2010 | Chidambarrao .. H01L 29/66787 257/302 |
|---|---|---|
| 9,245,885 B1 | 1/2016 | Xie et al. |
| 9,299,835 B1 | 3/2016 | Anderson et al. |
| 9,640,636 B1 | 5/2017 | Bentley et al. |
| 9,653,458 B1 | 5/2017 | Cheng et al. |

(Continued)

OTHER PUBLICATIONS

D. Yakimets et al., "Vertical GAAFETs for the ultimate CMOS scaling," IEEE Transactions on Electron Devices, vol. 62, No. 5, 2015, pp. 1433-1439.

(Continued)

*Primary Examiner* — Kyoung Lee
(74) *Attorney, Agent, or Firm* — Cantor Colburn LLP; Joseph Petrokaitis

(57) ABSTRACT

Vertical field effect transistor complementary metal oxide semiconductor (VFET CMOS) structures and methods of fabrication include a single mask level for forming the dual source/drains in both the NFET region and the PFET region. The VFET CMOS structures and methods of fabrication further include equal epi-to-channel distances in both the NFET region and PFET regions.

15 Claims, 14 Drawing Sheets

(56) References Cited

U.S. PATENT DOCUMENTS

| | | |
|---|---|---|
| 9,761,728 B1 | 9/2017 | Cheng et al. |
| 9,793,401 B1 | 10/2017 | Balakrishnan et al. |
| 2001/0002715 A1 | 6/2001 | Armacost et al. |
| 2006/0261406 A1 | 11/2006 | Chen |
| 2007/0148939 A1 | 6/2007 | Chu et al. |
| 2016/0043074 A1 | 2/2016 | Hurley et al. |
| 2018/0005895 A1 | 1/2018 | Cheng et al. |
| 2018/0012993 A1 | 1/2018 | Cheng et al. |

OTHER PUBLICATIONS

Kangguo Cheng et al."VFET CMOS Dual Epitaxy Integration", U.S. Appl. No. 15/986,886, filed May 23, 2018.
List of IBM Patents or Patent Applications Treated as Related; (Appendix P), Date Filed Sep. 13, 2019; 2 pages.

* cited by examiner

VFET CMOS DUAL EPITAXY INTEGRATION

DOMESTIC PRIORITY

This application is a continuation of U.S. application Ser. No. 15/986,886 titled "VFET CMOS DUAL EPITAXY INTEGRATION" filed May 23, 2018, the contents of which are incorporated by reference herein in its entirety.

BACKGROUND

The present invention relates in general to semiconductor device fabrication methods and resulting structures. More specifically, the present invention relates to fabrication methods and resulting semiconductor device structures including dual epitaxy integration of source or drains for vertical transport field effect transistors having complementary metal oxide semiconductor architectures.

In contemporary semiconductor device fabrication processes, a large number of semiconductor devices, such as field effect transistors (FETs), are fabricated on a single wafer. Some non-planar transistor device architectures, such as vertical field effect transistors (VFETs), employ semiconductor fins and side-gates, resulting in increased device density and performance over lateral devices. VFETs are one of the promising alternatives to standard lateral FET structures due to benefits, among others, in terms of reduced circuit footprint. In this type of structure, the current flow is perpendicular to a supporting wafer, unlike the lateral current flow in fin-type FETs (FinFETs).

Complementary metal oxide semiconductors (CMOS) generally use a combination of p-type and n-type metal oxide semiconductor field effect transistors (MOSFETs) for logic functions. For VFET CMOS, the n-type FET (NFET) uses an n-type doped source or drain (S/D) epitaxy such as phosphorous doped silicon (Si), and the p-type FET (PFET) uses a p-type doped source or drain epitaxy such as boron doped silicon-germanium (SiGe).

SUMMARY

According to one or more embodiments of the present invention, a VFET structure and a method for forming a VFET structure are provided. A non-limiting example of the method for forming a VFET CMOS structure includes forming an NFET region including one or more fins and a PFET region including one or more fins in a semiconductor substrate, wherein each of the fins includes a hardmask disposed on top surface thereof. A spacer layer is formed on sidewalls of the fins and the hardmask, and a first recess is formed in the semiconductor substrate below the fins in the NFET and the PFET regions. A first in-situ doped semiconductor is epitaxially grown in the first recess formed in the NFET and the PFET regions, wherein the first in-situ doped semiconductor is a p-type doped or an n-type doped semiconductor. A first dielectric liner layer is conformally deposited onto the semiconductor substrate, and a mask material is applied onto the PFET region if the first in situ doped semiconductor is a p-type doped semiconductor or onto the NFET region if the first in situ doped semiconductor is an n-type doped semiconductor. The first dielectric liner layer is removed from horizontal surfaces so as to expose a surface of the first in-situ doped semiconductor in the NFET region or the PFET region that is free of the mask material. The mask material is removed and the first epitaxial grown in-situ doped semiconductor is selectively removed from the NFET region or the PFET region that is free of the mask material to form a second recess. A second in-situ doped semiconductor is epitaxially grown in the second recess of the NFET region or the PFET region that is free of the mask, wherein the second in-situ doped semiconductor is an n-type doped semiconductor if the first in situ doped semiconductor is the p-type doped semiconductor or wherein the second in-situ doped semiconductor is a p-type doped semiconductor if the first in situ doped semiconductor is the n-type doped semiconductor such that the PFET region includes the p-type dopant semiconductor to define a PFET bottom source/drain and the NFET region includes the n-type dopant semiconductor to define a NFET bottom source/drain.

A non-limiting example of the method of forming a VFET CMOS structure includes forming an NFET region including one or more vertically oriented fins and a PFET region including one or more vertically oriented fins on a silicon substrate, wherein each of the fins include a hardmask disposed on top surface thereof. A spacer layer is formed on sidewalls of the one or more vertically oriented fins and hardmask and a portion of the silicon substrate underlying the one or more vertically oriented fins is removed to form a first recess therein. An in-situ boron doped SiGe is epitaxially grown in the first recess for both the NFET region and the PFET region and a first liner layer is conformally deposited on the silicon substrate. A mask material is applied on the PFET region, wherein the NFET region is free of the mask material and the first liner layer is directionally etched from horizontal surfaces in the NFET region, wherein the directionally etching exposes the boron doped SiGe in the NFET region. The mask material is removed from the PFET region, and the boron doped SiGe from the NFET region is replaced with an epitaxially grown in-situ phosphorous doped silicon such that the PFET region includes the in-situ boron doped SiGe to define a PFET bottom source/drain and the NFET region includes the in-situ phosphorous doped silicon to define a NFET bottom source/drain.

A non-limiting example of the VFET CMOS structure includes an NFET region and a PFET region. The NFET region includes one or more vertically oriented fins extending from a substrate and a bottom source/drain region that includes an epitaxially grown n-type doped semiconductor. The PFET region includes one or more vertically oriented fins extending from the substrate and a bottom source/drain region including an epitaxially grown p-type doped semiconductor, wherein a distance to an adjacent channel defined by the one or more vertically oriented fins in the PFET region is equal to a distance an adjacent channel defined by the one or more vertically oriented fins in the NFET region. A shallow trench isolation region formed in the substrate separates the NFET region and the PFET region.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
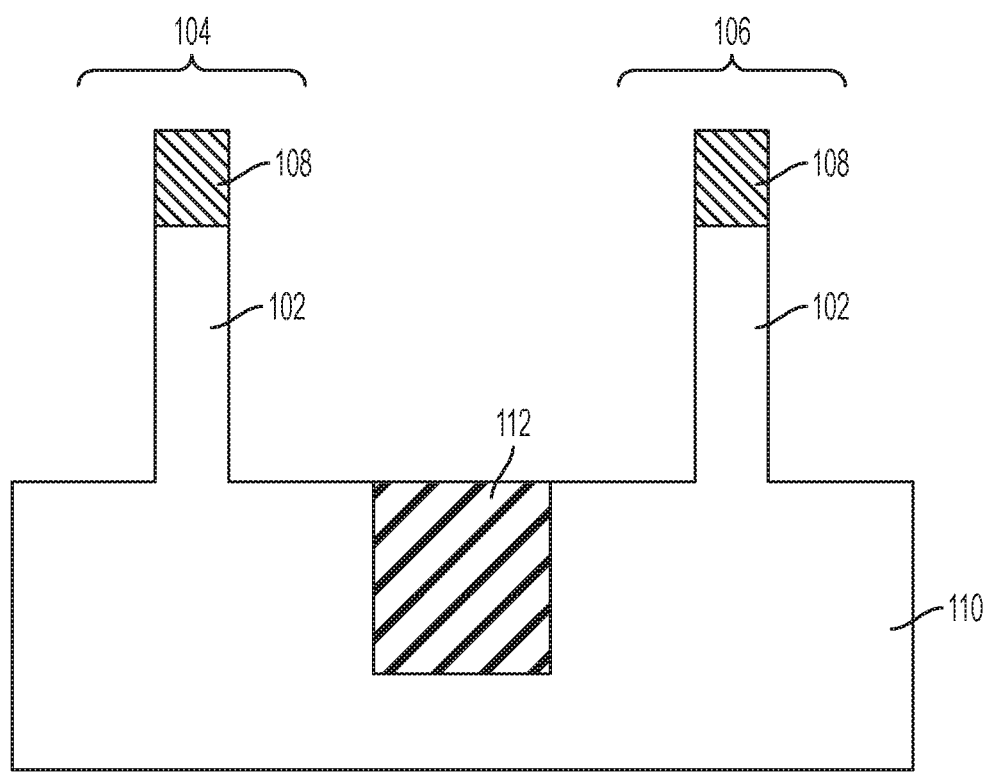
FIG. 1 depicts a cross-sectional view of a VFET structure up to formation of a top source or drain region according to one or more embodiments of the present invention.

Embodiments of the present invention are generally directed to VFET CMOS structures structure and methods including an NFET region and a PFET region. Typically, two mask levels are needed for epitaxially forming the source or drains when fabricating the p-type and n-type metal oxide semiconductor field effect transistors. After the first epitaxy process, a hardmask is typically utilized to protect the first epitaxial deposition during the second epitaxial deposition. The use of the hardmasks can result in uneven epitaxy channels between the NFET and the PFET. In embodiments of the present invention, a single mask level is used to form the different epitaxial regions. Moreover, embodiments of the present invention advantageously provides the NFET and the PFET with equal epi-to-channel distances as will be described in greater detail herein.

A method according to aspects of the invention generally includes recessing the silicon substrate after fin formation for both the NFET and PFET regions and epitaxially growing the same in-situ doped semiconductor in both the NFET and PFET regions. Because the recess and epitaxy processing is done at the same time for both the NFET and PFET regions, the different regions will have the same epi-to-channel distance. A mask is then provided over a selected one of the PFET or NFET regions and a selective directional etch process is used to expose the epitaxially grown doped semiconductor in the other one of the PFET or NFET regions. The mask can be removed and the epitaxially grown doped semiconductor selectively etched from the selected region, which is replaced with epitaxially grown in-situ n-type doped silicon specific for the region bottom source or drain, e.g., an n-type doped epitaxially grown semiconductor such as phosphorous boron. As such, a p-type doped semiconductor such as epitaxially grown boron doped SiGe remains in the PFET region. The VFET process flow is continued to provide the bottom spacer layer on the sources or drains for the NFET and the PFET regions and a gate structure about the fins. Top spacers and interlayer dielectric layers are deposited followed by formation of the top source or drains in a similar manner as that described for defining the bottom source or drains for the NFET and the PFET. Because the recess and initial epitaxy deposition of the same semiconductor material is done at the same time for both the NFET and PFET regions, the different regions will have the same epi-to-channel distance.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising", "includes", "including", "has," "having", "contains" or "containing", or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment", "an example embodiment", etc., indicate that the embodiment described can include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right", "left", "vertical", "horizontal", "top", "bottom", and derivatives thereof shall relate to the described structures and methods, as oriented in the drawing figures. The terms "overlying", "atop", "on top", "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to", such as, for example, "a first element selective to a second element", means that a first element can be etched and the second element can act as an etch stop.

For the sake of brevity, conventional techniques related to semiconductor device and integrated circuit (IC) fabrication are not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device utilizing a single masking level to form the source or drains regions for the NFET and PFET according to the present invention utilizes a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, cobalt, tungsten, etc.) and insulators (e.g., various forms of silicon dioxide, silicon nitride, SiBCN, SiOCN, SiCN, SiOC, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

Turning now to a more detailed description of technologies relevant to aspects of the present invention, as previously noted herein, some non-planar transistor device architectures, such as vertical field effect transistors, employ semiconductor fins and side-gates that can be contacted outside the active region, resulting in increased device density and performance over lateral devices.

Methods and structures for forming VFET CMOS with dual source or drain epitaxy by using only one mask level, and NFETs an PFEts having equal epi-to-channel distances in accordance with embodiments of the present invention are described in detail below by referring to the accompanying drawings in FIGS. 1-14.

FIG. 1 illustrates a cross-sectional view representative of a VFET CMOS structure 100 up to formation of fins (i.e., the vertical channel region) 102 for both the NFET and PFET regions, 104, 106, respectively, on a substrate 110. The fins 102, one of which is shown for each of the PFET and NFET regions 104, 106, respectively, extends vertically from the substrate 110. Stated differently, the fin 102 is normal to or perpendicular to the substrate 110 including a portion having a shape of a rectangular parallelepiped. The fins 102 include a hardmask 108 on a top surface. Any patterning technique can be used to form the fins as is known in the art including sidewall imaging transfer processes. The etching to form the fins 102 can include a dry etching process such as, for example, reactive ion etching, plasma etching, ion etching, or laser ablation.

Although only one fin is depicted in each region, multiple fins 102 can be arranged in each region such that the multiple fins 106 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each fin 102 includes a pair of parallel sidewalls along the lengthwise direction.

The direction along which a semiconductor fin 102 laterally extends the most is herein referred to as a "lengthwise direction" of the fin. The height of each semiconductor fin 102 can be in a range from about 5 nm to about 300 nm, although lesser and greater heights can also be employed. The width of each semiconductor fin 102 can be in a range from about 5 nm to about 100 nm, although lesser and greater widths can also be employed. In various embodiments, the fins 102 can have a width in the range of about 4 nm to about 20 nm, or can have a width in the range of about 5 nm to about 15 nm, or in the range of about 6 nm to about 8 nm. In various embodiments, the fin 102 can have a height in the range of about 25 nm to about 75 nm, or in the range of about 40 nm to about 50 nm. The channel length, i.e., length of the fin 102 in the vertical direction from the substrate 110, in the PFET region and the NFET region are equal to one another.

The hardmask 108 can include, for example, a silicon nitride (SiN) hardmask. The hardmask 108 can be deposited using a deposition process, including, but not limited to, PVD, CVD, PECVD, or any combination thereof. Other hard mask compositions can include silicon oxides, silicon oxynitrides, silicon carbides, silicon carbonitrides, etc. Spin-on dielectrics can also be utilized as a hard mask material including, but not limited to, silsequioxanes, siloxanes, and boron phosphate silicate glass (BPSG) or the like. The hardmask can have a single material or multiple materials.

A shallow trench isolation region 112 separates the NFET and PFET regions 104, 106, respectively, and can be formed earlier or later in the process. It should be apparent that embodiments of the present invention are not limited to this particular structure nor are they intended to be limited to any particular method for forming the VFET CMOS structure 100 up to formation of the fins.

The substrate 110 can be any suitable substrate material, such as, for example, any semiconductor material including, but not limited to, silicon. In one or more embodiments and when substrate 110 is a remaining semiconductor material portion of a bulk semiconductor substrate, the substrate 110 can be of a single crystalline semiconductor material, such as, for example, single crystalline silicon. In some embodiments, the crystal orientation of the remaining semiconductor portion of the bulk semiconductor substrate can be {100}, {110}, {111} or any other of the well-known crystallographic orientations. As will be described in greater detail below, each semiconductor fin 102 can include the same semiconductor material, or a different semiconductor material, from substrate 110.

In another embodiment, substrate 110 includes at least an insulator layer of a semiconductor-on-insulator (SOI) substrate (not specifically shown). Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer. The semiconductor layer of such an SOI substrate can be processed into semiconductor fins.

The handle substrate and the semiconductor layer of the SOI substrate can include the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one or more embodiments, the handle substrate and the semiconductor layer are both formed of silicon. In some embodiments, the handle substrate is a non-semiconductor material including, for example, a dielectric material and/or a conductive material. In yet other embodiments, the handle substrate can be omitted and the substrate 110 includes only an insulator layer.

In one or more embodiments, the handle substrate and the semiconductor layer can have the same or different crystal orientation. For example, the crystal orientation of the handle substrate and/or the semiconductor layer can be {100}, {110}, or {111}. Other crystallographic orientations besides those specifically mentioned can also be used in the present application. The handle substrate and/or the semiconductor layer of the SOI substrate can be a single crystalline semiconductor material, a polycrystalline material, or an amorphous material. Typically, at least the semiconductor layer is a single crystalline semiconductor material.

The insulator layer of the SOI substrate that can be employed as substrate 110 can be a crystalline or non-crystalline oxide and/or nitride. In one embodiment, the insulator layer is an oxide such as, for example, silicon dioxide. In another embodiment, the insulator layer is a nitride such as, for example, silicon nitride or boron nitride. In yet another embodiment, the insulator layer is a multi-layered stack of, in any order, silicon dioxide and one of silicon nitride or boron nitride.

The SOI substrate can be formed utilizing standard processes including for example, SIMOX (Separation by IMplantation of OXygen) or layer transfer. When a layer transfer process is employed, an optional thinning step can follow the bonding of two semiconductor wafers together. The optional thinning step reduces the thickness of the semiconductor layer to a layer having a thickness that is more desirable.

By way of example, the thickness of the semiconductor layer of the SOI substrate can be from about 10 nm to about 100 nm. Other thicknesses that are lesser than, or greater than, the aforementioned thickness range can also be used as the thickness of the semiconductor layer of the SOI substrate. The insulator layer of the SOI substrate can have a thickness from about 1 nm to about 200 nm. Other thicknesses that are lesser than, or greater than, the aforementioned thickness range can also be employed as the insulator layer.

The shallow trench isolation regions 112, one of which is shown, can be created early during the semiconductor device fabrication process, e.g., before the transistors such as the illustrated VFET are formed or after. The key steps for forming the shallow trench isolation regions typically involve etching a pattern of trenches in the substrate 110, depositing one or more dielectric materials (such as silicon dioxide) to fill the trenches, and removing the excess dielectric using a technique such as chemical-mechanical planarization.

Figure 2:
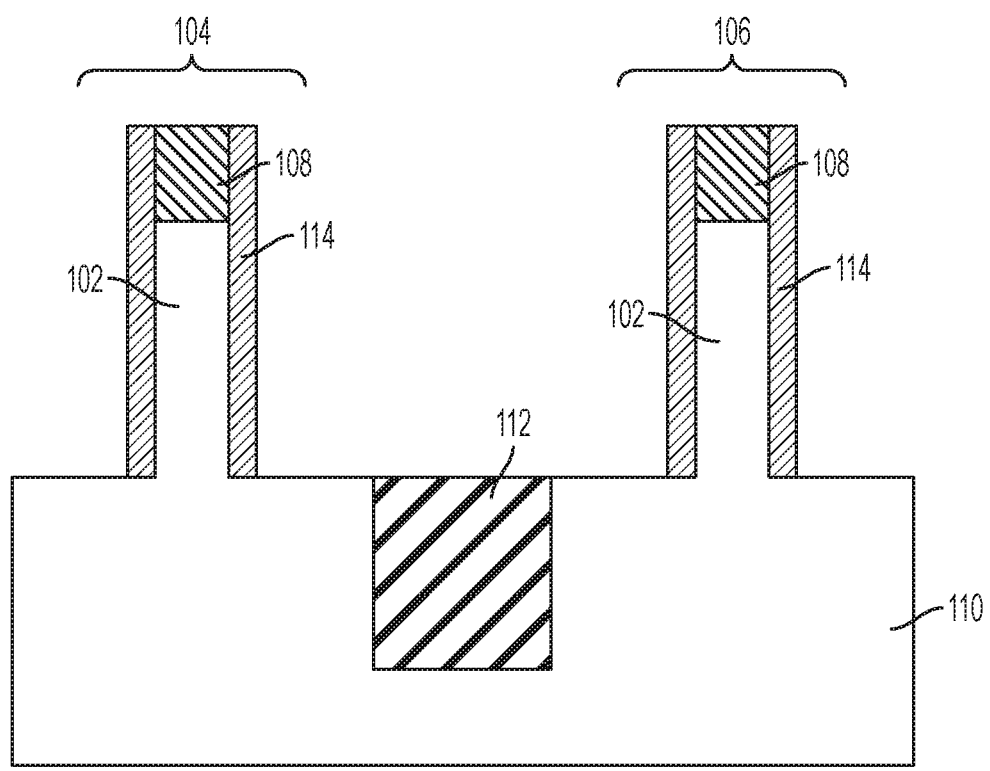
FIG. 2 depicts the cross-sectional view of the VFET structure after formation of a doped source/drain layer on the VFET structure of FIG. 1, wherein a multifaceted doped single crystalline silicon is formed on a channel region surface according to one or more embodiments of the present invention.

FIG. 2 depicts the VFET CMOS structure 100 after a conformal deposition of a sacrificial layer of material 114 (e.g., silicon nitride) around the entire outer perimeter of the fins 102 and hardmask 108 on the top of the fins 102. The sacrificial layer 114 may be formed to any desired thickness. An anisotropic etch process such as a reactive ion etch process is used to remove the sacrificial spacer layer from horizontal surfaces such that the sacrificial spacer layer 114 remains on the vertical sidewalls of the fins 102 and hardmask 108.

Figure 3:
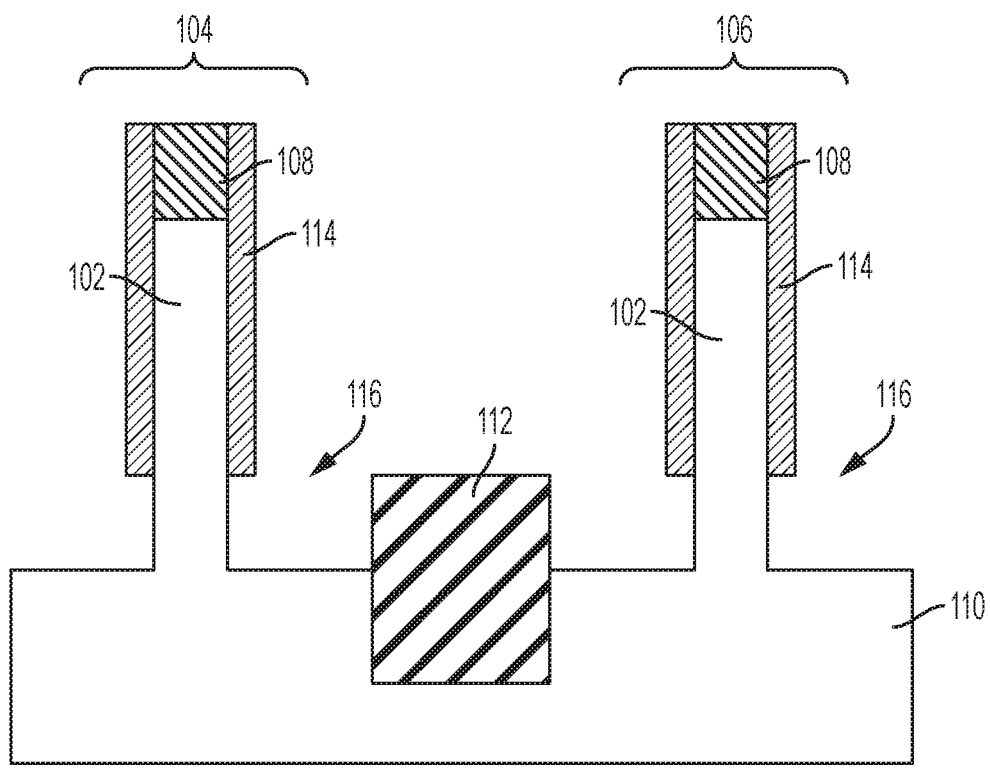
FIG. 3 depicts the cross-sectional view of the VFET structure of FIG. 2 subsequent to deposition of a non-uniform spacer material on the multifaceted doped single crystalline silicon according to one or more embodiments of the present invention.

FIG. 3 depicts the VFET CMOS structure 100 subsequent to etching the substrate 110 to form a recess 116 below the fins 102 using a selective etch process. The amount of substrate removed will generally correspond to a thickness of the epitaxially grown bottom source or drain regions (referred to herein as source/drain), which will be formed later in the process. Optionally, a timed, isotropic etching process can also be performed to laterally trim the recess further such that the in-situ doped epitaxial semiconductor to as the bottom source/drains can be grown closer to the fin 102 to improve junction sharpness.

Figure 4:
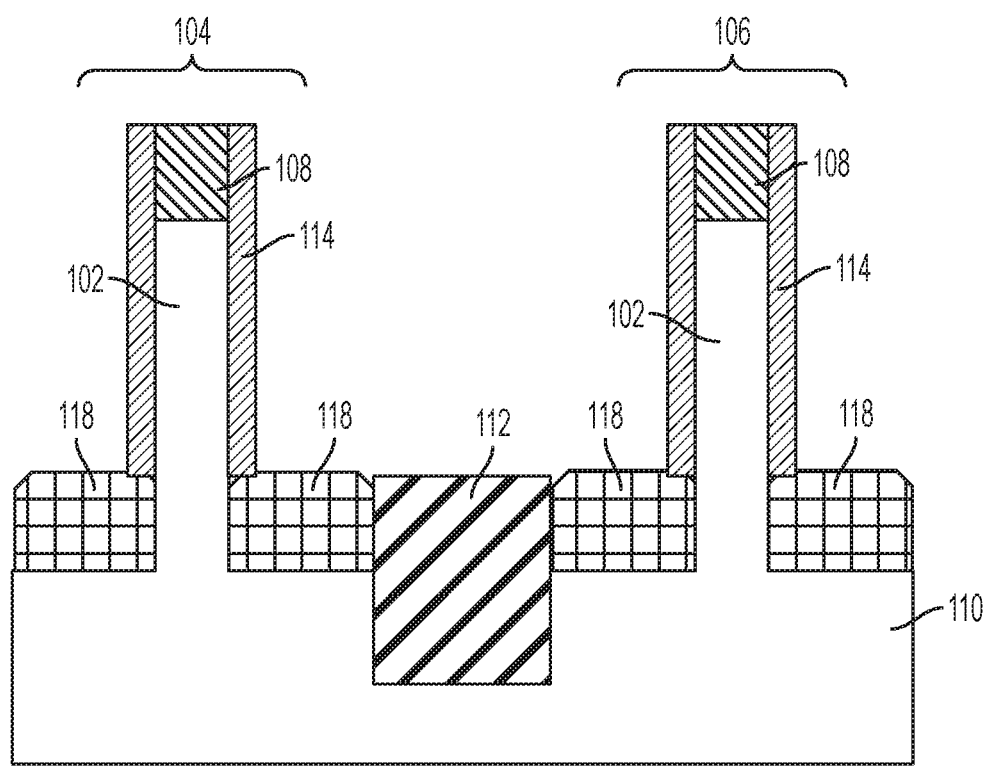
FIG. 4 depicts the cross-sectional view of the VFET structure of FIG. 3 subsequent to top spacer and dummy gate removal according to one or more embodiments of the present invention.

FIG. 4 depicts the VFET CMOS structure 100 subsequent to epitaxially growing the same in-situ doped semiconductor 118 in the recesses for both the NFET and PFET regions 104, 106, respectively. The bottom epitaxial in-situ doped semiconductor 118 can be an n-type doped semiconductor or a p-type doped semiconductor. By way of example, an in-situ boron-doped SiGe 118 can be epitaxially grown in the recess of both the NFET and PFET regions.

The bottom epitaxy layer 118 (or top epitaxial layer as provided when forming the top source/drain) can be formed by epitaxial growth and/or deposition. As used herein, the terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In one or more embodiments, the gas source for the deposition of epitaxial semiconductor material can include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. The particular epitaxial region is not intended to be limited and will generally depend on the type of VFET being formed.

The epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 500° C. to 900° C.

Figure 5:
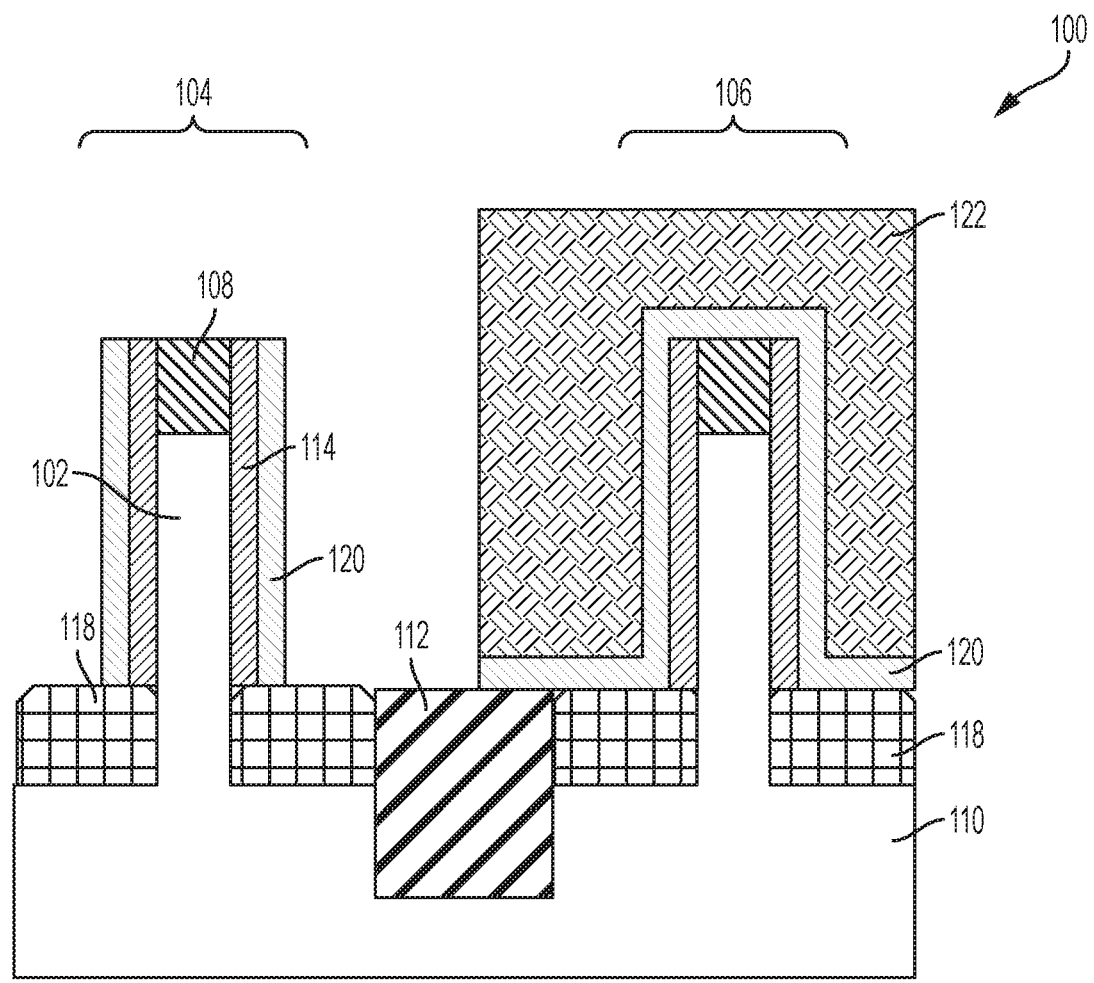
FIG. 5 depicts the cross-sectional view of the VFET structure of FIG. 4 subsequent to a replacement high-k metal gate process according to one or more embodiments of the present invention.

FIG. 5 depicts the VFET structure 100 subsequent to conformal deposition of a dielectric liner layer 120 such as silicon nitride, for example onto the substrate 110. A mask 122 is then applied to a selected one of the NFET or PFET regions, 104 Or 106, respectively, which is generally dependent on the type of epitaxially grown in-situ doped semiconductor 118 that was initially deposited in the recesses of both the NFET and PFET regions. By way of example, the PFET region is masked with a mask material 122 when the epitaxially grown in-situ doped semiconductor 118 in both the NFET and PFET regions is a p-type doped semiconductor material such as an in-situ boron-doped SiGe. As another example, the NFET region can be masked when the epitaxially grown in-situ doped semiconductor 118 in both the NFET and PFET regions is an n-type dopant semiconductor material, e.g., in-situ phosphorous-doped silicon. Subsequent to masking a selected one of the NFET or PFET regions, the line layer 120 is subjected to a selective directional etch such as reactive ion etching to remove the liner layer 120 from the exposed horizontal surfaces, thereby exposing the epitaxially grown in-situ doped semiconductor 118 in the unmasked area. As shown, the unmasked area corresponds to the NFET region 104. Using the example above wherein the epitaxially grown in-situ doped semiconductor 118 in both the NFET and PFET regions is an in-situ boron-doped SiGe, the removal of the liner layer 120 exposes the epitaxially grown in-situ boron-doped SiGe in the NFET region 104.

Figure 6:
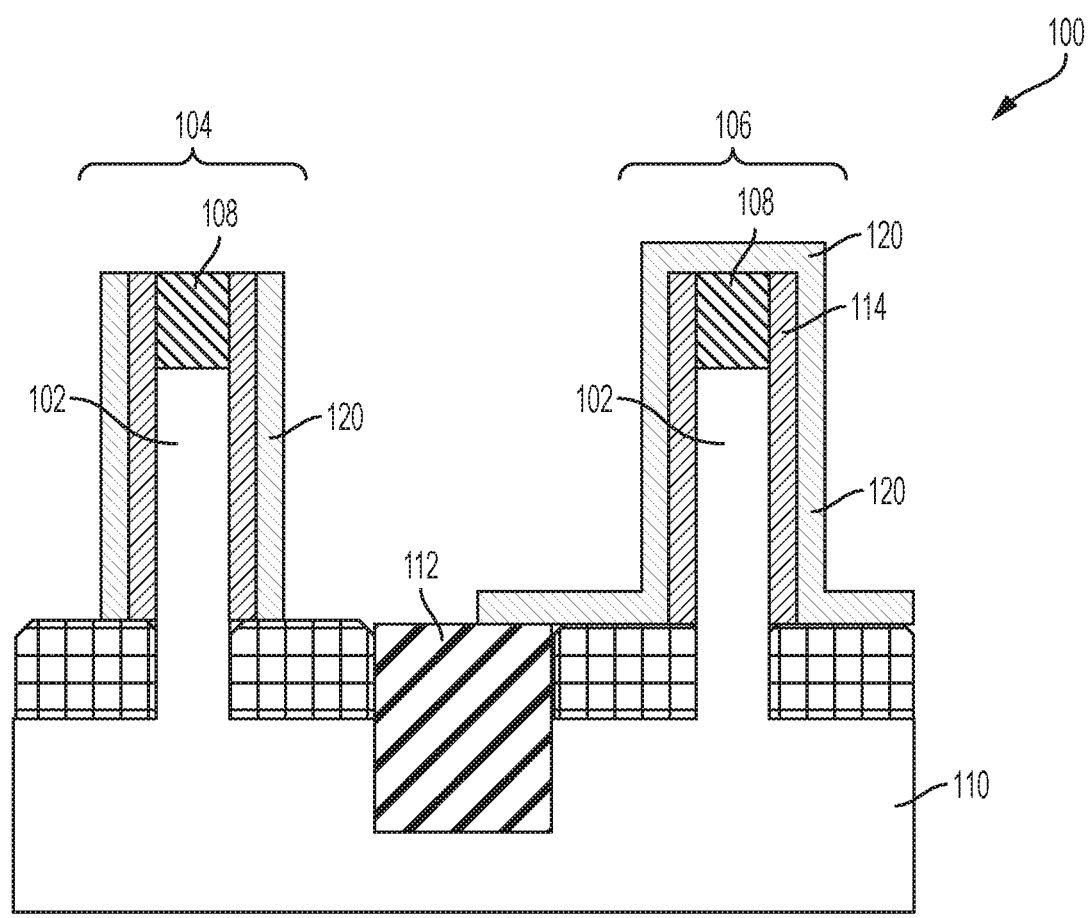
FIG. 6 depicts an enlarged cross-sectional view of the top source or drain of the VFET structure of FIG. 5 according to one or more embodiments of the present invention.

FIG. 6 depicts the VFET CMOS structure 100 subsequent to removal of the mask 122 from the selected region, e.g., the PFET region 106 as noted in the example above and as shown. The conformal liner layer 120 that was previously deposited and protected by the mask 122 protects the underlying in situ doped regions in the selected region, e.g., the in situ doped boron doped SiGe formed in the PFET region 106.

Figure 7:
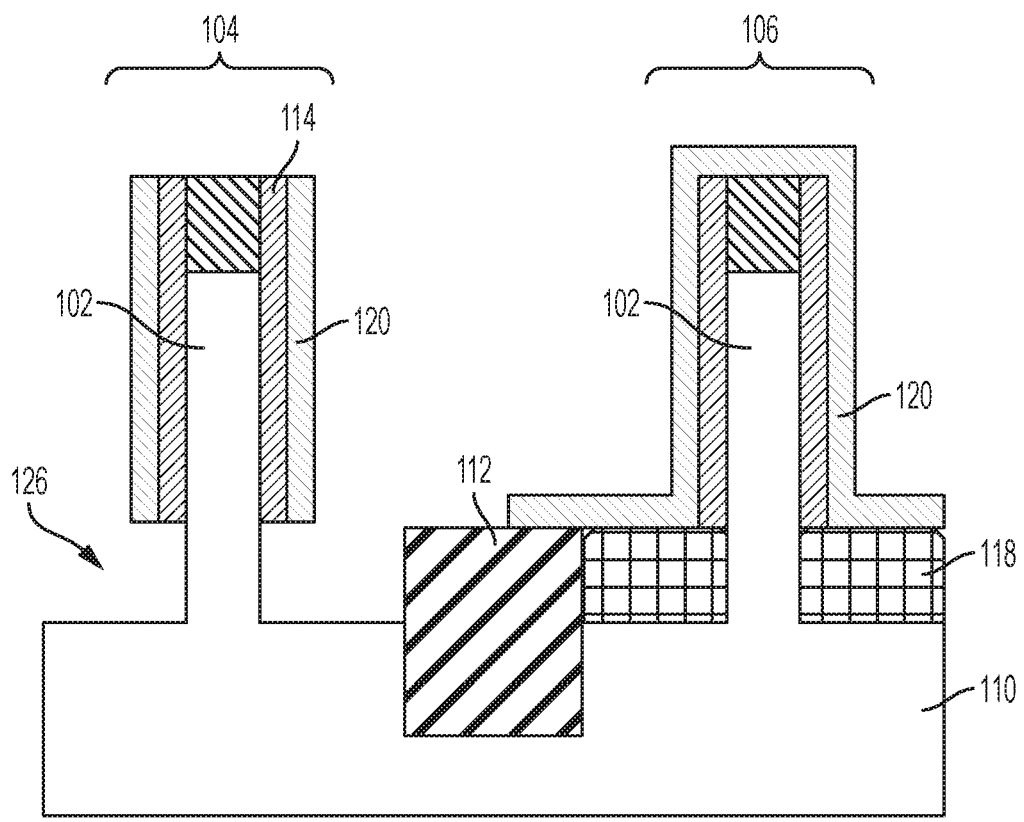
FIG. 7 depicts an enlarged cross-sectional view of the top source or drain of the VFET structure of FIG. 5 according to one or more embodiments of the present invention.

FIG. 7 depicts the VFET CMOS structure 100 subsequent to selective removal of the epitaxially grown in-situ doped semiconductor 118 that is not protected by the liner layer 120 to form a recess 126, e.g., the epitaxially grown in-situ boron-doped SiGe in the NFET region 104. The epitaxially grown in-situ boron-doped SiGe can be selectively removed by an HCl gas phase etch process to form the recess 126 in the NFET region 104.

Figure 8:
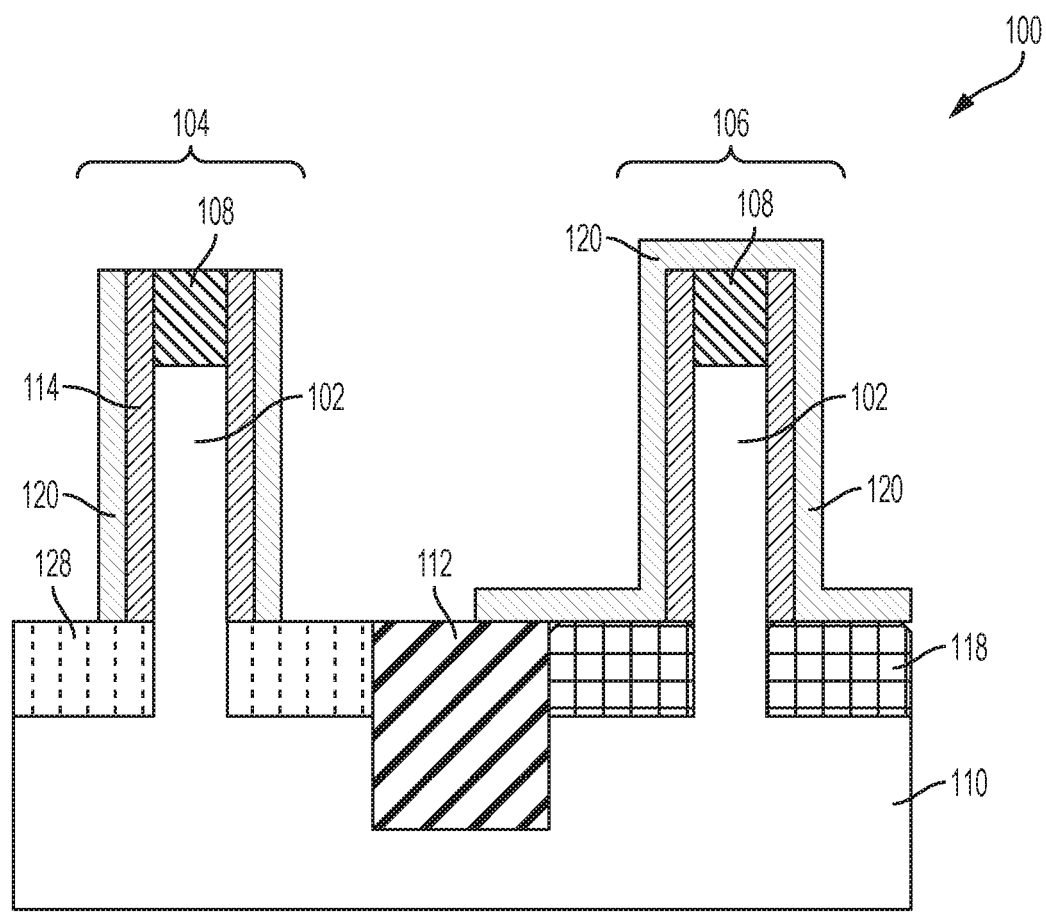
FIG. 8 depicts an enlarged cross-sectional view of the top source or drain of the VFET structure of FIG. 5 according to one or more embodiments of the present invention.

FIG. 8 depicts the VFET CMOS structure 100 subsequent to epitaxially growing an in situ doped semiconductor 128 in the recess 126. Continuing with the above example, wherein the p-type doped semiconductor was deposited in both the NFET and PFET regions 104, 106, respectively, and the mask 122 was specific for the PFET region 106, the epitaxially grown in-situ doped semiconductor 128 corresponding to the NFET region 104 can be a phosphorous doped silicon. It should be apparent layers 114, 120 about vertical sidewalls of the fins 102 in the NFET region 104 have no effect on the placement of the epitaxially grown in-situ doped n-type semiconductor as this material simply replaces the epitaxially grown in-situ doped p-type semiconductor that was initially formed in both the NFET and PFET regions 104, 106, respectively. As such, the VFET structure now includes an epitaxially grown in-situ doped n-type semiconductor as the bottom source/drain in the NFET region 104 and an epitaxially grown in-situ doped p-type semiconductor in the PFET region 106, wherein a single mask level was used and wherein the epi-to-channel lengths of the fins 102 are the same for both the NFET and PFET regions, 104, 106, respectively. The same epi-to-channel lengths are the same in both the NFET and PFET regions 104, 106, respectively, because the initial recessing of the substrate 110 to form recess 116 is done at the same time for both the NFET and PFET regions. The removal of the p-type doped semiconductor by HCl (FIG. 7) and the epitaxial growth of the n-type doped semiconductor (FIG. 8) can be done in two separate processing equipment, or alternatively, the removal and growth can be performed in the same epitaxy chamber by first flowing HCl to remove the p-type doped semiconductor followed by epitaxially growing the n-type doped semiconductor.

Figure 9:
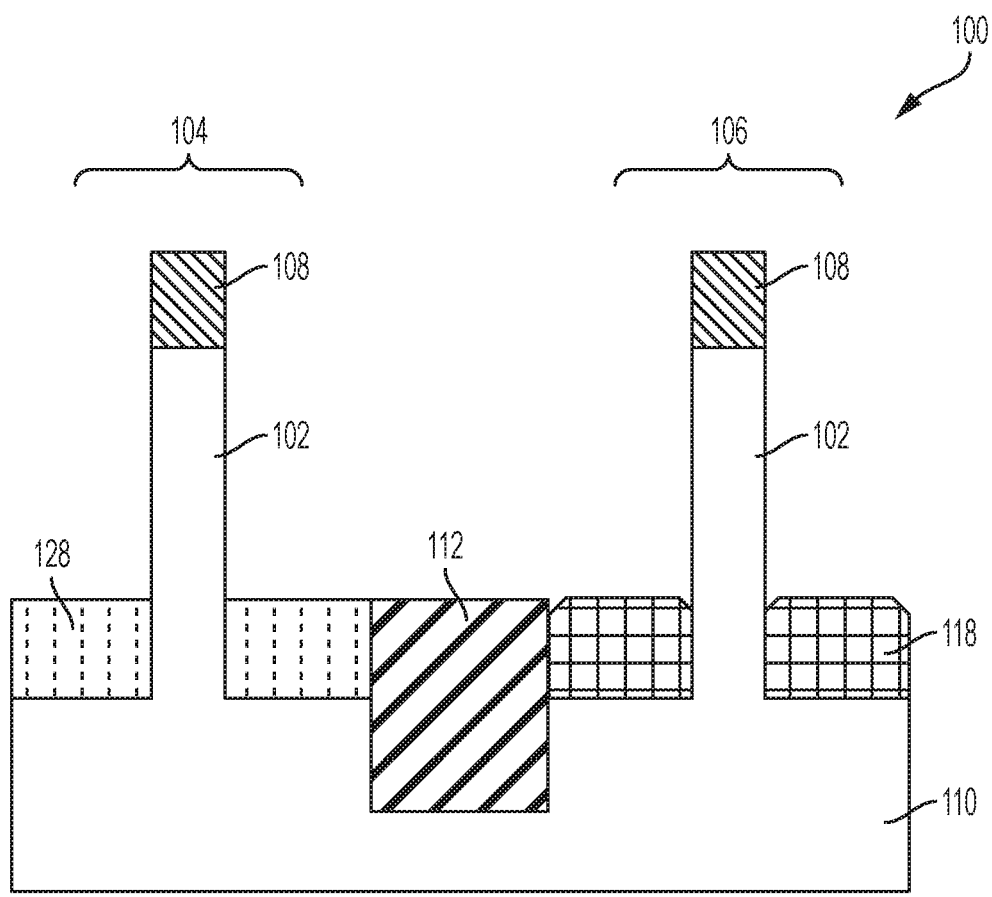
FIG. 9 depicts an enlarged cross-sectional view of the top source or drain of the VFET structure of FIG. 5 according to one or more embodiments of the present invention.

In FIGS. 9-13, formation of the top source/drains for both the NFET and PFET regions, 104, 106, will now be described for fabricating the VFET CMOS structure 100. The process is similar to that for forming the bottom source/drains for the NFET and PFET regions 104, 106, respectively, describe above. In FIG. 9, the layers 114, 120 are removed by a suitable etch process specific to the materials defining these layers. The resulting VFET CMOS structure 100 includes a substrate 100 including one or more vertically oriented fins 102 in both the NFET and PFET regions 104, 106, respectively. A protective hardmask 108 remains on a top surface of the fins 102. The NFET region 104 includes a bottom source/drain 128 including an n-type doped semiconductor material and the PFET region 106 includes a bottom source/drain 128 including an n-type doped semiconductor material. The epi-to channel length (i.e., distance) is the same for each region. A shallow trench isolation 112 region separates the NFET and PFET regions 104, 106, respectively.

Figure 10:
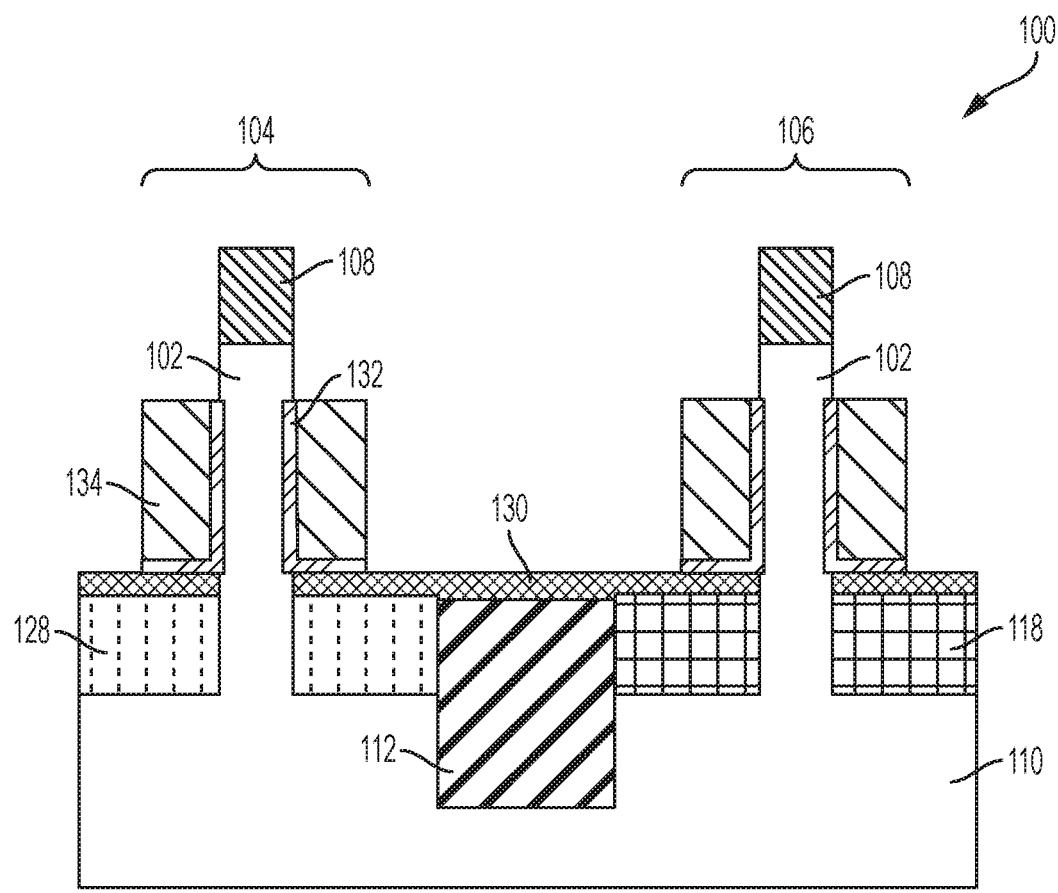
FIG. 10 depicts an enlarged cross-sectional view of the top source or drain of the VFET structure of FIG. 5 according to one or more embodiments of the present invention.

FIG. 10 depicts the VFET CMOS structure 100 subsequent to formation of the bottom spacer layer 130 and a gate dielectric 132 and gate conductor 134 structure about the fins 102. The bottom spacer layer 130 can be directionally deposited onto the substrate 110 by any non-conformal deposition methods that provides a faster deposition rate on the planar surface and slower deposition rate on the sidewall surfaces including but not limited to plasma vapor deposition (PVD), high density plasma (HDP) deposition or the like. After directional deposition of bottom spacer 130, an etch-back process can be performed to remove the any residue of spacer materials from the fin sidewalls. In PVD, a pure source material is gasified via evaporation, the application of high power electricity, laser ablation, or the like. The gasified material will then condense on the substrate material to create the desired layer. In one or more embodiments, the bottom spacer 130 can be a low k dielectric material. The term "low k dielectric" generally refers to an insulating material having a dielectric constant less than silicon nitride, i.e., less than 7.0. Exemplary low k dielectric materials include, but are not limited to, dielectric nitrides (e.g., silicon nitride, SiBCN), dielectric oxynitrides (e.g., SiOCN), or any combination thereof or the like.

In some exemplary embodiments, the bottom spacer layer 130 can include a material that is resistant to some etching processes such as, for example, HF chemical etching or chemical oxide removal etching. In one or more embodiments, the spacer 130 can have a thickness in the range of about 3 nm to about 10 nm, or in the range of about 4 nm to about 6 nm.

The high-dielectric constant (high-k) layer is deposited as a gate dielectric 132 and followed by the formation of metal gate 134. The gate dielectric 132 can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

The gate can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition. In some embodiments, the gate can further include a work function setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Figure 11:
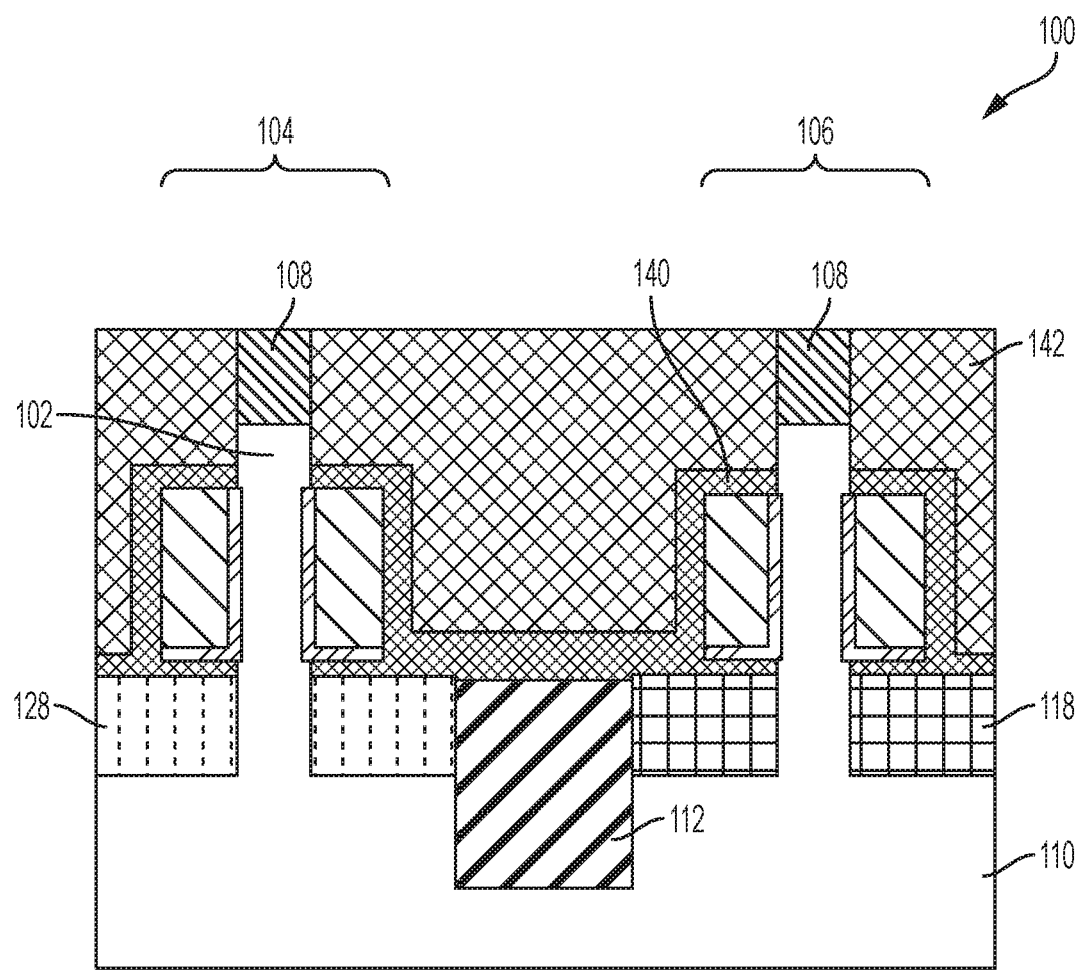
FIG. 11 depicts an enlarged cross-sectional view of the top source or drain of the VFET structure of FIG. 5 according to one or more embodiments of the present invention.

FIG. 11 depicts the VFET CMOS structure 100 subsequent to conformal deposition of a sacrificial top spacer layer 140 on the gate dielectric 132 and gate conductor 134 structure. In one or more embodiments, the sacrificial top spacer layer 140 can be a conformal nitride liner, e.g., SiN, of the interlayer dielectric 140, which is deposited thereon as shown. An interlayer dielectric (ILD) 142 is then deposited onto the substrate 110 and the substrate is subjected to a chemical-mechanical planarization selective to the hard mask 108 to remove any excess portion of the ILD 142. Any known composition and manner of forming the ILD 142 can be utilized. By way of example, the ILD can include any dielectric material including inorganic dielectrics or organic dielectrics. Some examples of suitable dielectrics that can be used as the dielectric material include, but are not limited to: silicon oxide, silsequioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The ILD can be deposited by spin on processes, PECVD processes or the like as is generally known in the art.

Figure 12:
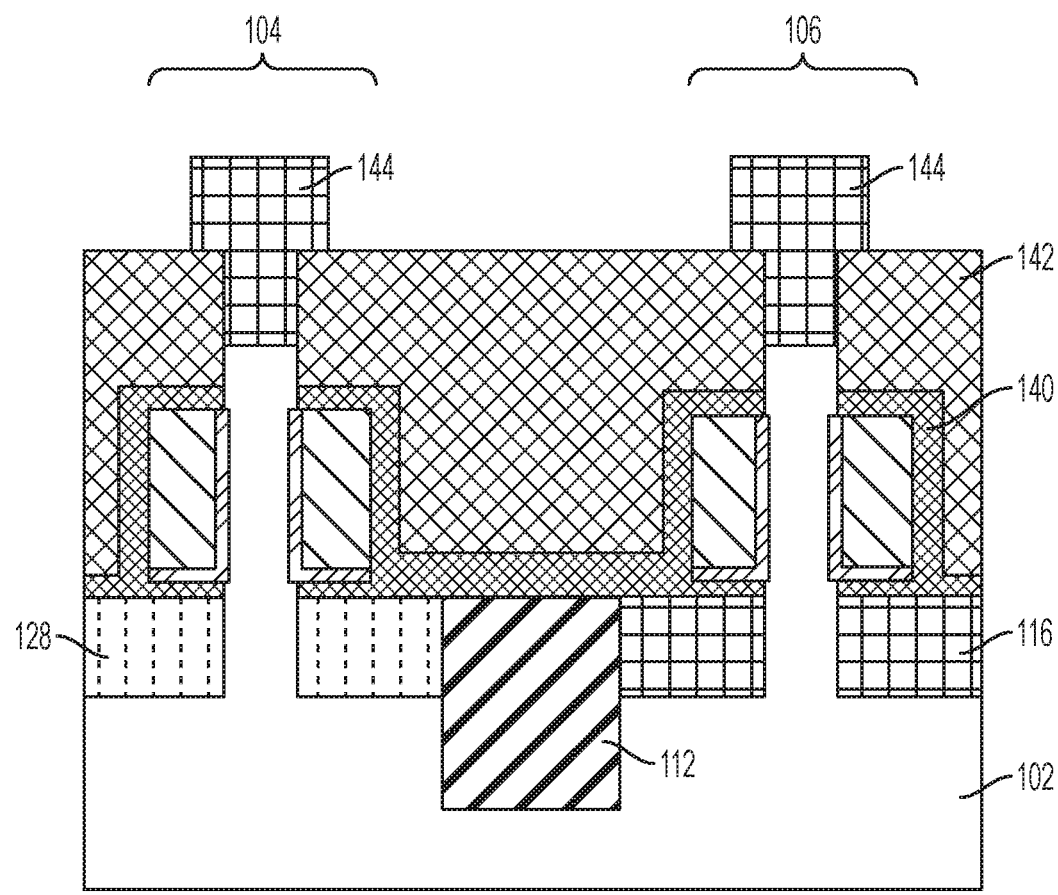
FIG. 12 depicts an enlarged cross-sectional view of the top source or drain of the VFET structure of FIG. 5 according to one or more embodiments of the present invention.

FIG. 12 depicts the VFET CMOS structure 100 subsequent to a hardmask pull from the interlevel dielectric 142, i.e., selective removal of the hardmask 108 that had previously protected the tops of the fins 102. Similar to the formation of the bottom source/drains (118, 128), the same epitaxially grown in-situ doped semiconductor 144 is grown from the top surface of the fins 102 for both the NFET and PFET regions 104, 106, respectively. The top epitaxial in-situ doped semiconductor 144 can be an n-type doped semiconductor or a p-type doped semiconductor and will generally be of the same type as the bottom source/drain. By way of example and similar to the example given above with respect to the bottom source drain, an in-situ boron-doped SiGe 118 can be epitaxially grown on top of the fins 102 for both the NFET and PFET regions 104, 106, respectively.

Figure 13:
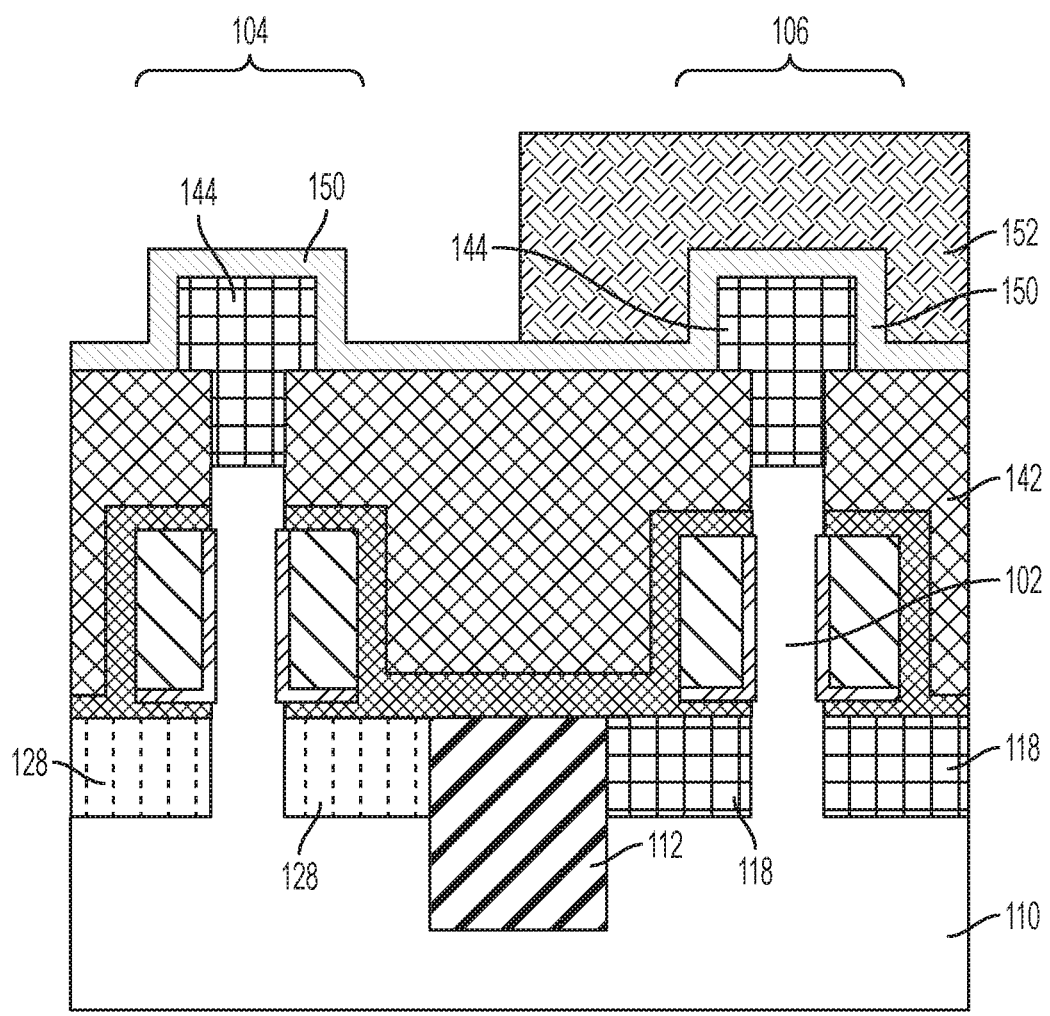
FIG. 13 depicts an enlarged cross-sectional view of the top source or drain of the VFET structure of FIG. 5 according to one or more embodiments of the present invention.

FIG. 13 depicts the VFET CMOS structure 100 subsequent to deposition of a conformal liner layer 150 followed by deposition of a mask 152 over a selected one of the NFET or PFET regions, 104, 106, respectively. As shown, in the example given, when the epitaxially grown in-situ doped semiconductor 144 is a p-type doped semiconductor material such as boron doped SiGe, the mask 152 is provided over the PFET region 106.

Figure 14:
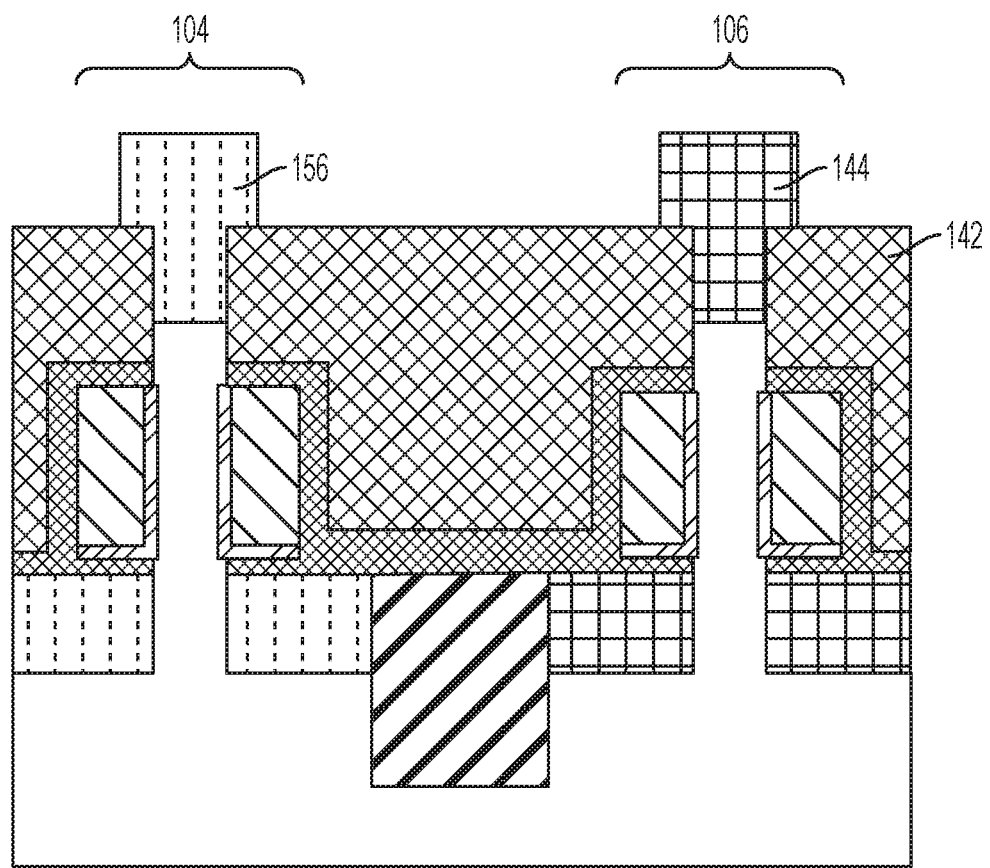
FIG. 14 depicts an enlarged cross-sectional view of the top source or drain of the VFET structure of FIG. 5 according to one or more embodiments of the present invention.

FIG. 14 depicts the VFET structure 100 subsequent to removal of the liner 150 in the unmasked region, e.g., NFET region 104 as shown, using an etch process to selectively remove the liner layer relative to the interlevel dielectric 142, and the mask material 152 (see FIG. 131). A selective etch process is then used to remove the p-type doped semiconductor material from the unmasked region using, for example, an HCl vapor phase etch process to selectively remove the boron doped SiGe from the top of the NFET region 104. Once removed, an in situ n-type doped semiconductor is epitaxially grown on the top of the fins 102 in the NFET region 104. The masks and liner layer are then etched from the PFET region 106 to provide the VFET CMOS structure 100 as shown. The VFET CMOS structure 100 includes top source/drains 144, 156 formed using a single mask level that are appropriately doped for the NFET and PFET regions 104, 106, respectively.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A vertical field effect transistor complementary metal oxide (VFET CMOS) structure comprising:
    an n-type field effect transistor (NFET) region comprising:
        one or more vertically oriented fins extending from a substrate;
        a bottom source or drain (S/D) region comprising an epitaxially grown n-type doped semiconductor adjacent a lower portion of the one or more vertically oriented fins extending from the substrate;
    a p-type field effect transistor (PFET) region comprising:
        one or more vertically oriented fins extending from the substrate;
        a bottom S/D region comprising an epitaxially grown p-type doped semiconductor adjacent a lower portion of the one or more vertically oriented fins extending from the substrate, wherein a distance from the bottom S/D region comprising the epitaxially grown p-type doped semiconductor to an adjacent channel defined by the one or more vertically oriented fins in the PFET region is equal to a distance from the bottom S/D region comprising the epitaxially grown n-type doped semiconductor to an adjacent channel defined by the one or more vertically oriented fins in the NFET region;
    a shallow trench isolation region formed in the substrate separating the NFET region and the PFET region.

2. The VFET CMOS structure of claim 1, further comprises an epitaxially grown top S/D in the NFET region and an epitaxially grown top S/D in the PFET region.

3. The VFET CMOS structure of claim 2, wherein the epitaxially grown top S/D and the epitaxially grown bottom S/D in the NFET regions comprises phosphorous doped silicon and wherein the epitaxially grown top S/D and the epitaxially grown bottom S/D in the PFET regions comprises boron doped silicon germanium.

4. The VFET CMOS structure of claim 1, wherein the one or more vertically oriented fins extending from the substrate is at a height within a range of about 5 nanometers to about 300 nanometers and a width within a range of about 5 nanometers to about 100 nanometers.

5. The VFET CMOS structure of claim 1, wherein the substrate comprises silicon.

6. The VFET CMOS structure of claim 1, wherein the shallow trench isolation region comprises a dielectric material.

7. The VFET CMOS structure of claim 2, wherein the epitaxially grown bottom S/D in the NFET regions comprises phosphorous doped silicon and wherein the epitaxially grown bottom S/D in the PFET regions comprises boron doped silicon germanium.

8. The VFET CMOS structure of claim 1, further comprising a bottom spacer layer overlying the bottom S/D regions of the PFET and NFET regions.

9. The VFET CMOS structure of claim 8, wherein the bottom spacer layer comprises a low k dielectric material.

10. The VFET CMOS structure of claim 9, wherein the dielectric material comprises a dielectric nitride, dielectric oxynitride, or any combination thereof.

11. The VFET CMOS structure of claim 1, further comprising a high gate dielectric material on at least a portion of the sidewalls of the one or more vertically oriented fins extending from the substrate in the NFET and PFET regions; and a metal gate thereon.

12. The VFET CMOS structure of claim 11, wherein the high gate dielectric material comprises hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, or lead zinc niobite.

13. The VFET CMOS structure of claim 11, wherein the metal gate comprises doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or combinations thereof.

14. The VFET CMOS structure of claim 11, further comprising a work function metal between the high gate dielectric material and the metal gate.

15. The VFET CMOS structure of claim 14, wherein the work function metal comprises titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

* * * * *